United States Patent
Choi

(10) Patent No.: US 8,810,321 B2
(45) Date of Patent: Aug. 19, 2014

(54) OSCILLATOR AUTO-TRIMMING METHOD AND SEMICONDUCTOR DEVICE USING THE METHOD

(75) Inventor: Kwang Ho Choi, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 153 days.

(21) Appl. No.: 13/611,058

(22) Filed: Sep. 12, 2012

(65) Prior Publication Data

US 2013/0187722 A1 Jul. 25, 2013

(30) Foreign Application Priority Data

Jan. 19, 2012 (KR) .................. 10-2012-0006383

(51) Int. Cl.
*H03L 7/085* (2006.01)

(52) U.S. Cl.
USPC ............ 331/1 A; 331/16; 331/44; 331/177 R; 327/159

(58) Field of Classification Search
CPC ............... H03L 1/00; H03L 7/00; H03L 7/02; H03L 7/099; H03L 7/087
USPC ................... 331/1 A, 16, 44, 177 R; 327/159
See application file for complete search history.

(56) References Cited

U.S. PATENT DOCUMENTS

| | | | |
|---|---|---|---|
| 6,329,860 B1 * | 12/2001 | Komatsu | 327/291 |
| 7,446,615 B2 * | 11/2008 | Okuda | 331/16 |
| 8,008,978 B2 | 8/2011 | Deguchi | |
| 8,073,092 B2 * | 12/2011 | Thomsen | 375/373 |
| 8,085,099 B2 * | 12/2011 | Pancholi et al. | 331/17 |
| 2004/0008060 A1 * | 1/2004 | Watanabe | 327/116 |
| 2005/0046452 A1 * | 3/2005 | Briones | 327/156 |
| 2008/0094053 A1 | 4/2008 | Han et al. | |
| 2008/0238555 A1 * | 10/2008 | Chapski et al. | 331/44 |
| 2009/0316847 A1 | 12/2009 | Thomsen | |

FOREIGN PATENT DOCUMENTS

| | | |
|---|---|---|
| JP | 2011191867 | 9/2011 |
| KR | 20080036715 | 4/2008 |
| KR | 1020110106824 | 9/2011 |

\* cited by examiner

*Primary Examiner* — Arnold Kinkead
(74) *Attorney, Agent, or Firm* — F. Chau & Associates, LLC

(57) ABSTRACT

An oscillator auto-trimming method is provided. The oscillator auto-trimming method includes receiving, by a subtractor, a first count result and second count result to output a difference between the first count result and the second count result as an offset frequency, receiving, by a divider, the offset frequency to output a divided signal corresponding to a result of dividing the offset frequency by a reference offset frequency output from a micro control unit, and receiving, by the micro control unit, the divided signal and determine whether to change an oscillator frequency.

20 Claims, 5 Drawing Sheets

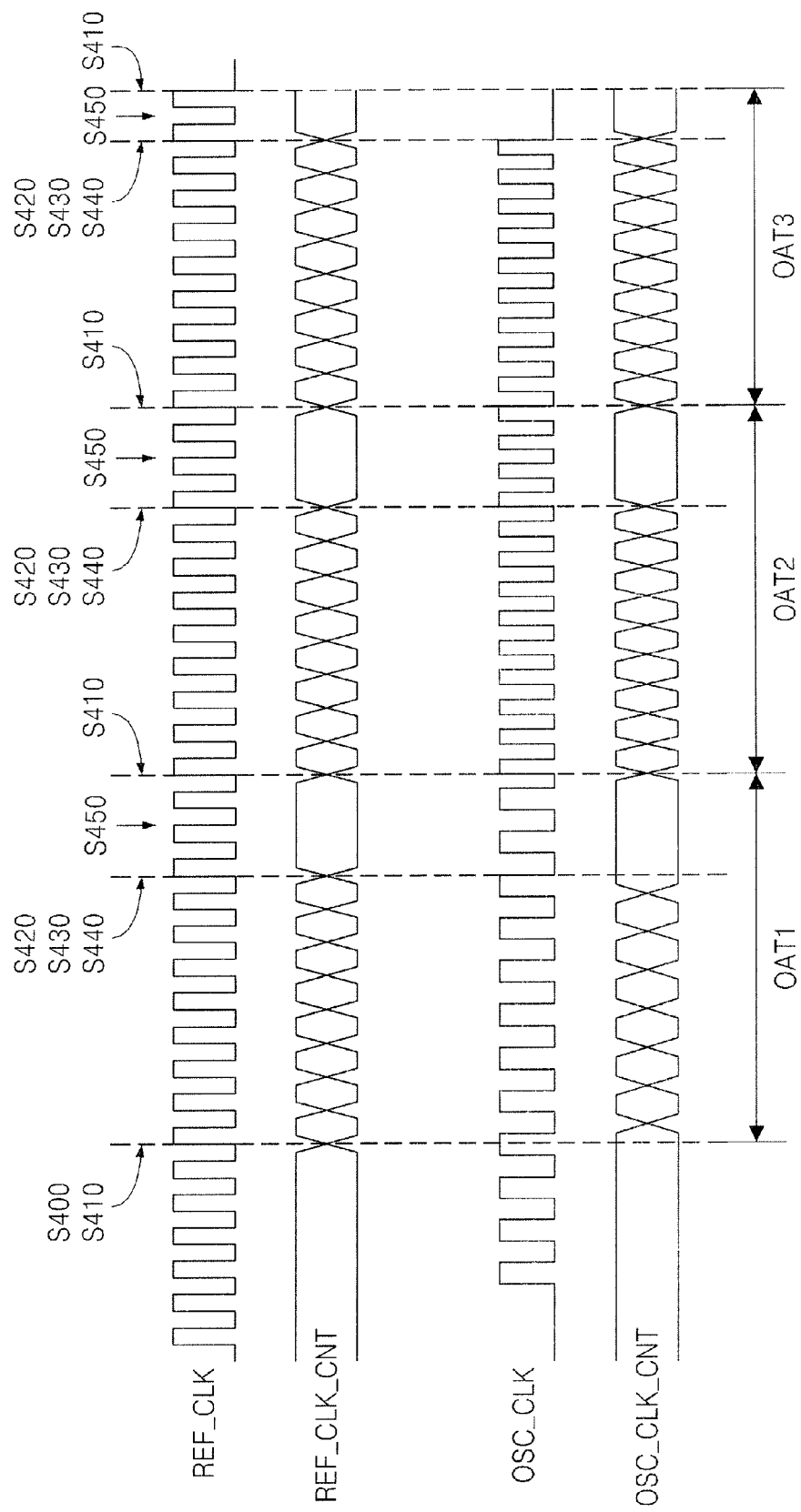

OSCILLATOR AUTO-TRIMMING METHOD AND SEMICONDUCTOR DEVICE USING THE METHOD

CROSS-REFERENCE TO RELATED APPLICATIONS

This application claims priority under 35 U.S.C. §119(a) to Korean Patent Application No. 10-2012-0006383 filed on Jan. 19, 2012, the disclosure of which is incorporated by reference in its entirety herein.

TECHNICAL FIELD

Embodiments of the inventive concept relate to an oscillator auto-trimming method, and more particularly, to an oscillator auto-trimming method for a semiconductor device.

DISCUSSION OF RELATED ART

Flash memory is non-volatile computer storage that can be electrically erased and reprogrammed. An oscillator circuit can be used to generate an internal clock signal used within the flash memory. An example of the oscillator circuit is a ring oscillator comprising an odd number of inverters connected in series with one another, where an output of the last inverter is fed back as an input to the first inverter. However, the intended period or frequency of a clock signal generated by the ring oscillator can change substantially due to process-voltage-temperature (PVT) variations. While the flash memory may include a circuit that compensates for these period or frequency changes, the addition of the circuit increases its manufacturing cost.

SUMMARY

According to an exemplary embodiment of the inventive concept, a semiconductor device having an oscillator auto-trimming function includes an oscillator, a subtractor, a divider, and an oscillator set register. The oscillator is configured to generate an oscillator clock signal. The subtractor is configured to receive a first count result and second count result and output a difference between the first count result and the second count result as an offset frequency. The divider is configured to receive the offset frequency and output a divided signal corresponding to a result of dividing the offset frequency by a reference offset frequency. The oscillator set register is configured to receive the divided signal, to change a reference index into a target index by subtracting or adding the divided signal from or to the reference index, and to transmit an oscillator trimming code corresponding to the target index to the oscillator. The first count result is determined by a frequency of a reference clock signal and the second count result is determined by a frequency of the oscillator clock signal.

The semiconductor device may further include a micro control unit configured to transmit the reference offset frequency to the divider and an embedded flash memory configured to store an oscillator trimming code corresponding to each of the reference and target indexes of the oscillator set register.

When the divided signal is less than 1, the micro control unit may store the oscillator trimming code corresponding to the target index of the oscillator set register as a target oscillator trimming code.

When the micro control unit receives the divided signal at least a predetermined number of times, the micro control unit may store the oscillator trimming code corresponding to the target index of the oscillator set register as the target oscillator trimming code.

According to an exemplary embodiment of the inventive concept, an oscillator auto-trimming method includes: a subtractor receiving a first count result and a second count result and outputting a difference between the first count result and the second count result as an offset frequency, a divider receiving the offset frequency and outputting a divided signal corresponding to a result of dividing the offset frequency by a reference offset frequency output from a micro control unit, and the micro control unit receiving the divided signal and determining whether to change an oscillator frequency. The first count result is determined by a frequency of a reference clock signal and the second count result is determined by a frequency of the oscillator clock signal.

The oscillator auto-trimming method may further include an oscillator set register receiving the divided signal, changing a reference index into a target index by subtracting or adding the divided signal from or to the reference index, and transmitting an oscillator trimming code corresponding to the target index to an oscillator.

The oscillator auto-trimming method may further include the micro control unit storing an oscillator trimming code corresponding to the reference index and the oscillator trimming code corresponding to the target index in an embedded flash memory when the oscillator frequency does not need to be changed.

According to an exemplary embodiment of the inventive concept, a semiconductor device comprising an oscillator auto-trimming function includes an oscillator, a subtractor, a divider, and a control circuit. The oscillator is configured to generate an oscillator clock signal based on receipt of a trimming code. The subtractor is configured to receive a first count result and second count result and output a difference between the first count result and the second count result as an offset frequency. The divider is configured to receive the offset frequency and output a divided signal corresponding to a result of dividing the offset frequency by a reference offset frequency. The control circuit is configured to determine a target frequency based on offsetting a reference index by the result and output the trimming code based on the target frequency.

The control circuit may be configured to compare the current result with a prior result, where the offsetting one of i) adds or ii) subtracts the result to the reference index, based on a result of the compare. In an embodiment when the result of the compare indicates the current result is higher than the prior result, the offsetting performs an operation on the reference index that is opposite that of a prior offsetting operation.

The control circuit may include a register storing a plurality of indexes and a micro control unit configured to output the reference offset frequency based on a difference between two of the indexes that are adjacent one another.

The semiconductor device may further include a flash memory configured to store the trimming code along with an indicator indicating a die on which the device is fabricated.

BRIEF DESCRIPTION OF THE DRAWINGS

The inventive concept will become more apparent by describing in detail exemplary embodiments thereof with reference to the attached drawings in which:

FIG. 5 is a timing chart showing the operations illustrated in FIG. 4 according to an exemplary embodiment of the inventive concept.

DETAILED DESCRIPTION

Figure 1:
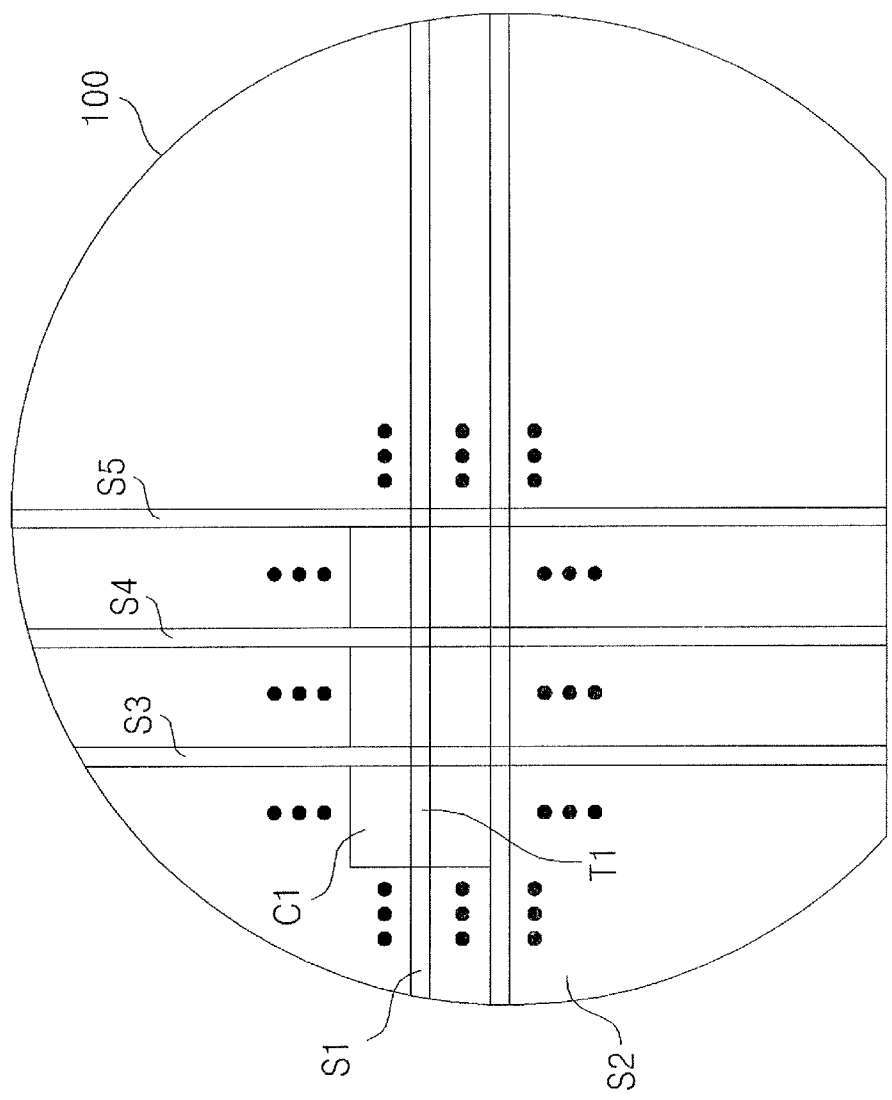
FIG. 1 is a diagram of a chip implemented on a wafer.

The inventive concept now will be described more fully hereinafter with reference to the accompanying drawings, in which exemplary embodiments of the invention are shown. This invention may, however, be embodied in many different forms and should not be construed as limited to the exemplary embodiments set forth herein. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. As used herein, the singular forms "a", "an" and "the" are intended to include the plural forms as well, unless the context clearly indicates otherwise.

FIG. 1 is a diagram of a chip C1 implemented on a wafer 100. Referring to FIG. 1, the wafer 100 is cut along a plurality of scribe lines S1 through S5 in a packaging process, which enables the chip C1 to be packaged.

Before the wafer 100 is cut, a test circuit including an oscillator is used to test the chip C1 while operating at high speed on the wafer 100. In an exemplary embodiment, the test circuit is disposed at scribe line region T1. The oscillator included in the test circuit generates an oscillation signal when it is connected to a pattern (e.g., a contact, an active resistor, a metal line, a poly resistor, etc.) according to a design rule for the chip C1.

For example, the oscillator may be implemented by a delay chain including a plurality of inverters. Among those inverters, two adjacent inverters are connected in series to each other through the pattern. The pattern is connected between an output terminal of one of the two adjacent inverters and an input terminal of the other one of the two adjacent inverters. The output and input terminals function as a probe and the oscillator generates the oscillation signal.

An oscillation frequency is measured or calculated based on the oscillation signal generated with respect to each pattern. Whether the chip C1 is faulty is determined based on whether the oscillation frequency is within a predetermined reference frequency range.

However, when the size of the chip C1 is decreased below a threshold size and the operating frequency of the chip C1 increased above a threshold operating frequency, when the oscillation frequency increases beyond a threshold oscillation frequency (e.g., to at least a gigahertz (GHz)), it may be difficult to measure the oscillation frequency and expensive measuring equipment may be required to measure the oscillation frequency.

Moreover, since the measuring equipment requires a large number of pads to measure the oscillation frequency, the scribe line region T1 accommodating the test circuit increases the area of the wafer 100. As a result, the yield of chips decreases.

An oscillator and/or an oscillator tester can be implemented within the chip C1 in an exemplary embodiment of the invention. At least one embodiment of the invention may increase the yield of chips C1 by decreasing the size of the scribe line region T1.

Figure 2:
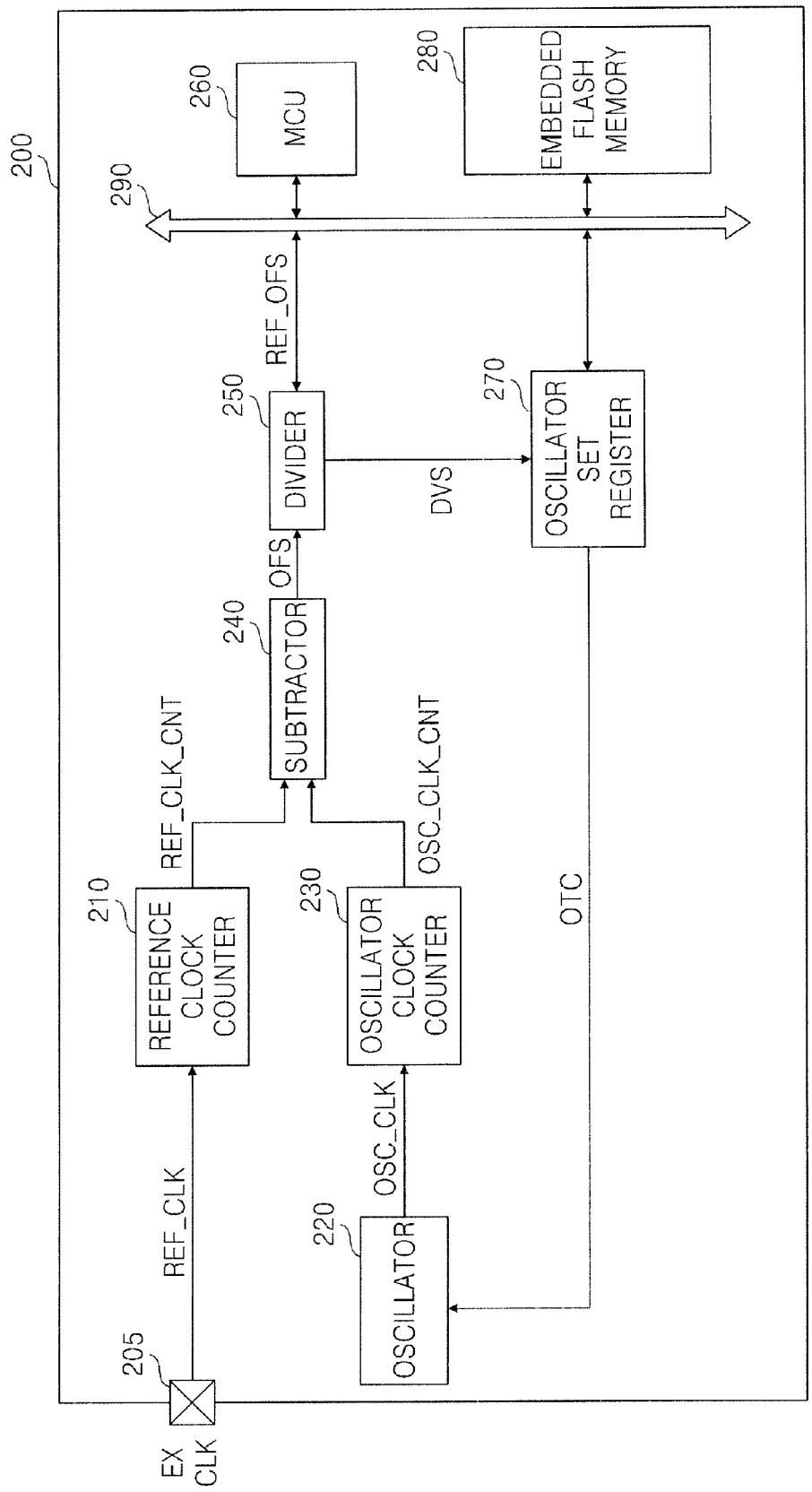
FIG. 2 is a block diagram of a semiconductor device having an oscillator auto-trimming function according to an exemplary embodiment of the inventive concept.

FIG. 2 is a block diagram of a semiconductor device 200 having an oscillator auto-trimming function according to an exemplary embodiment of the inventive concept. Referring to FIG. 2, the semiconductor device 200 includes an external clock pin 205, a reference clock counter 210, an oscillator 220, an oscillator clock counter 230, a subtractor 240, a divider 250, a micro control unit (MCU) 260, an oscillator set register 270, and an embedded flash memory 280.

In an exemplary embodiment, the external clock pin 205 receives a reference clock signal REF_CLK having a frequency necessary for the normal operation of the semiconductor device 200 from a source outside the semiconductor device 200. The reference clock counter 210 may count the reference clock signal REF_CLK received from the external clock pin 205 for a reference time to measure the frequency of the reference clock signal REF_CLK. In exemplary embodiment, the reference clock counter 210 counts the reference clock signal REF_CLK for the reference time and outputs a first count result REF_CLK_CNT. In an exemplary embodiment, the first count result REF_CLK_CNT is initially 0, and the reference clock counter 210 increments the count result each time a portion of the reference clock signal REF_CLK repeats during the reference time. In an exemplary embodiment, the reference clock counter 210 increments the count result for each pulse of the reference clock signal REF_CLK encountered during the reference time. In an exemplary embodiment, the first count result REF_CLK_CNT is a digital signal comprised of a plurality of bits including information about the frequency of the reference clock signal REF_CLK. For example, the device 200 may include a table of entries, where each entry includes a frequency and a different bit pattern, and the frequency associated with the information of the first count result REF_CLK_CNT is the frequency of the entry whose bit pattern matches the information.

In an exemplary embodiment, the oscillator 220 receives an oscillator trimming code (OTC) in a digital format and generates an oscillator clock signal OSC_CLK having a predetermined frequency based on the code. The oscillator 220 may be an RC oscillator, a relaxation oscillator, a Wien bridge oscillator that generates sine waves, or a twin-T oscillator, but it is not restricted thereto.

The oscillator clock counter 230 may count the oscillator clock signal OSC_CLK received from the oscillator 220 for a reference time to measure the frequency of the oscillator clock signal OSC_CLK. In an exemplary embodiment, the oscillator clock counter 230 counts the oscillator clock signal OSC_CLK for the reference time and outputs a second count result OSC_CLK_CNT. In an exemplary embodiment, the second count result OSC_CLK_CNT is initially 0, and the oscillator clock counter 230 increments the count result each time a portion of the oscillator clock signal OSC_CLK repeats during the reference time. In an exemplary embodiment, the oscillator clock counter 230 increments the count result for each pulse of the oscillator clock signal OSC_CLK encountered during the reference time. In an exemplary embodiment, the second count result OSC_CLK_CNT is a digital signal comprising a plurality of bits including information about the frequency of the oscillator clock signal OSC_CLK. For example, the device 200 may include a table of entries, where each entry includes a frequency and a different bit pattern, and the frequency associated with the information of the second count result OSC_CLK_CNT is the frequency of the entry whose bit pattern matches the information.

In an exemplary embodiment, the subtractor 240 calculates a difference between two data values input in a digital format. The subtractor 240 may be a full-subtractor or a half-subtractor, but it is not restricted thereto. In an exemplary embodiment, the subtractor 240 receives the first count result REF_CLK_CNT from the reference clock counter 210 and the second count result OSC_CLK_CNT from the oscillator clock counter 230 and outputs a difference between the first count result REF_CLK_CNT and the second count result OSC_CLK_CNT as an offset frequency OFS.

In an exemplary embodiment, the divider 250 receives two data values in a digital format and outputs a result of dividing one data value by the other data value. In an exemplary embodiment, the divider 250 receives the offset frequency OFS from the subtractor 240 and outputs a divided signal DVS corresponding to a result of dividing the offset frequency OFS by a reference offset frequency REF_OFS output from the MCU 260. The divider 250 may output the divided signal DVS with the accuracy of integer values. In an exemplary embodiment, the reference offset frequency REF_OFS refers to a difference between frequency values corresponding to the oscillator trimming codes (OTCs) corresponding to adjacent indexes in an oscillator trimming code area 284 (see FIG. 3) included in the embedded flash memory 280, which will be described later. An OTC may be a code enabling the oscillator 220 to generate the oscillator clock signal OSC_CLK having a particular frequency.

In an exemplary embodiment, the MCU 260 is an exclusive processor for controlling the embedded flash memory 280. In an exemplary embodiment, the MCU 260 includes a read-only memory (ROM) and/or a random access memory (RAM). In an exemplary embodiment, the MCU 260 executes programs and operations. In an exemplary embodiment, the MCU 260 permanently or temporarily stores data. In an exemplary embodiment, the MCU 260 reads a program code from the embedded flash memory 280 and executes a particular program. The MCU 260 may store the reference offset frequency REF_OFS and transmit the reference offset frequency REF_OFS to the divider 250 to enable the division to be performed.

When the oscillator set register 270 changes a reference index into a target index in response to the divided signal DVS, the MCU 260 may output an index subtraction/addition signal indicating whether the divided signal DVS is added to or subtracted from the reference index. In an exemplary embodiment, the MCU 260 receives and stores divided signals DVS output from the divider 250, compares a current divided signal DVS with a divided signal DVS generated in a previous oscillator auto-trimming operation, and outputs an index subtraction/addition signal that instructs execution of a reverse operation of a previous one when the current divided signal DVS is higher than the previous divided signal DVS. In an exemplary embodiment, if the previous operation was an addition, the reverse operation is a subtraction. For example, if the previous divided signal DVS was 4, the current divided signal DVS is 9, and the prior operation was a subtraction, the MCU 260 will instruct that an addition be performed.

The MCU 260 may determine whether to repeat oscillator auto-trimming based on a divided signal DVS received from the divider 250. In an exemplary embodiment, when the divided signal DVS is at least 1, e.g., when the offset frequency OFS is equal to or greater than the reference offset frequency REF_OFS, the MCU 260 controls the oscillator set register 270 to transmit an OTC to the oscillator 220, so that the oscillator auto-trimming is repeated. However, when the divided signal DVS is less than 1, e.g., when the offset frequency OFS is less than the reference offset frequency REF_OFS, the MCU 260 may terminate the oscillator auto-trimming, transmit an OTC corresponding to the target index to the oscillator 220, and store the OTC in the embedded flash memory 280 as a target OTC. In an exemplary embodiment, the embedded flash memory 280 includes a table where each entry includes a target OTC and an indicator of the particular die on which an electronic circuit is fabricated.

In an exemplary embodiment, when the MCU 260 receives the divided signal DVS less than a predetermined number of times, for examples, less than three times, the MCU 260 controls the oscillator set register 270 to transmit an OTC to the oscillator 220, so that the oscillator auto-trimming is repeated. However, when the MCU 260 receives the divided signal DVS at least the predetermined number of times, for example, at least three times, the MCU 260 may terminate the oscillator auto-trimming, transmit an OTC corresponding to the target index to the oscillator 220, and store the OTC in the embedded flash memory 280 as a target OTC.

The oscillator set register 270 may be implemented by an index register. The oscillator set register 270 may be a register that stores a numerical value used to change an operand when a code is extracted from the embedded flash memory 280. The oscillator set register 270 may store an index corresponding to the oscillator trimming code area 284, which may be included in the embedded flash memory 280.

In an exemplary embodiment, the oscillator set register 270 receives a divided signal DVS from the divider 250 and changes the reference index into the target index by subtracting or adding the divided signal DVS from or to the reference index. In an exemplary embodiment, whether the oscillator set register 270 subtracts or adds the divided signal DVS from or to the reference index is determined by the index subtraction/addition signal output from the MCU 260. The oscillator set register 270 may read an OTC corresponding to the target index from the embedded flash memory 280 and transmit the OTC to the oscillator 220 using a buffering operation. In an exemplary embodiment, the reference index is the index that corresponds to an OTC at the beginning of the oscillator auto-trimming. In an exemplary embodiment, the target index is the index that has been changed by adding or subtracting the divided signal DVS, e.g., a result of dividing the offset frequency OFS by the reference offset frequency REF_OFS, to or from the reference index.

In an exemplary embodiment, the embedded flash memory 280 is a merged flash and logic (MFL) element in which flash memory and a logic element are merged. Since individual memory and logic elements are implemented in a single chip, compactness, low-power consumption, high speed, and low electromagnetic interference (EMI) noise may be realized. The embedded flash memory 280 may include a program code area 282 and the oscillator trimming code area 284 illustrated in FIG. 3. The program code area 282 may store various program codes necessary for the operation of the semiconductor device 200 and transmit a program code to the MCU 260 when necessary. The oscillator trimming code area 284 may store OTCs corresponding to the reference index and the target index of the oscillator set register 270.

In an exemplary embodiment, the embedded flash memory 280 transmits the OTC corresponding to the target index to the oscillator set register 270 according to the control of the MCU 260. In an exemplary embodiment, when the oscillator auto-trimming is terminated by the control of the MCU 260, the embedded flash memory 280 stores the OTC corresponding to the target index in the oscillator trimming code area 284 as a target OTC.

Data, commands, and codes may be transferred among the divider 250, the MCU 260, the oscillator set register 270, and the embedded flash memory 280 via a bus 290. The semiconductor device 200 may be a semiconductor device manufactured in an integrated circuit (IC) chip. At least one embodiment of the inventive concept may be applied to a central processing unit (CPU), a memory device, a controller, etc., which are manufactured in an IC chip, but the inventive concept is not restricted thereto.

When the semiconductor device 200 according to at least one embodiment of the inventive concept is used, frequency correction is independently performed on each die having different frequency values on the wafer 100 and a target OTC of the semiconductor device 200 included in each die is individually stored. Accordingly, test and correction can be performed on a plurality of dies at a time, thereby reducing a test time. In addition, even after the dies are separated from the wafer 100, test and correction can still be performed.

Figure 3:
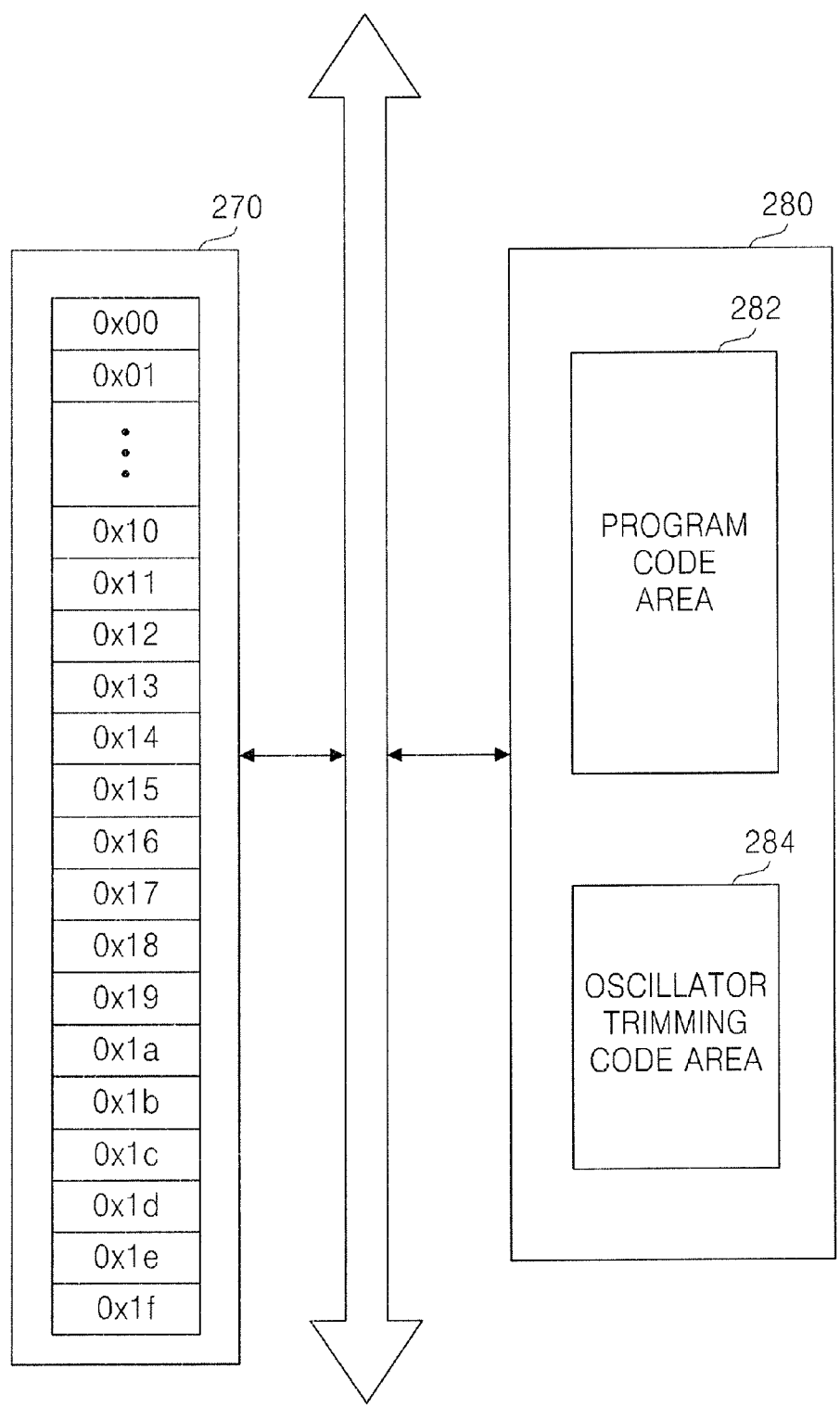
FIG. 3 is a block diagram of a part of the semiconductor device illustrated in FIG. 2 according to an exemplary embodiment of the inventive concept.

FIG. 3 is a block diagram of a part of the semiconductor device 200 illustrated in FIG. 2 according to an exemplary embodiment of the inventive concept. Referring to FIGS. 2 and 3, an OTC may be transmitted between the oscillator set register 270 and the embedded flash memory 280 via the bus 290. The divider 250 may transmit the divided signal DVS, which is the result of dividing the offset frequency OFS by the reference offset frequency REF_OFS, to the oscillator set register 270. The oscillator set register 270 may change a reference index into a target index based on the divided signal DVS and transmit an OTC corresponding to the target index to the oscillator 220 according to the control of the MCU 260.

For example, it is assumed that the reference index is 0x16 and a frequency corresponding to an OTC corresponding to 0x16 is 10,000 kHz. Indexes adjacent the reference index are 0x15 and 0x17 and frequencies respectively corresponding to OTCs respectively corresponding to the adjacent indexes may be 9,900 kHz and 10,100 kHz. Similarly, a difference between frequencies respectively corresponding to two adjacent indexes may be 100 kHz. In this example, since the reference offset frequency REF_OFS stored in the MCU 260 is a difference between frequencies respectively corresponding to OTCs respectively corresponding to two adjacent indexes, it may be 100 kHz.

When the frequency of the reference clock signal REF_CLK is 10,450 kHz and the offset frequency OFS output by the subtractor 240 is 450 kHz in the first oscillator auto-trimming operation, the divider 250 may output a divided signal DVS corresponding to a value of 4.5, which is the result of dividing the offset frequency OFS of 450 kHz by the reference offset frequency REF_OFS of 100 kHz, to the MCU 260 and the oscillator set register 270. In an exemplary embodiment where the divider 250 outputs the divided signal DVS in integer units, the divided signal DVS has a value of 4 or 5. For example, the value of 4.5 may be rounded up to 5 or rounded down to 4. The oscillator set register 270 may change the reference index (e.g., 0x16) into the target index according to the control of the MCU 260. When the MCU 260 outputs the index subtraction/addition signal instructing to subtract the divided signal DVS of 5 from the reference index (e.g., 0x16), the target index may be 0x11 (e.g., 0x16−5=0x11). In an exemplary embodiment, the MCU 260 outputs an index subtraction/addition signal and the reference index to the oscillator set register 270, and the register 270 uses the index subtraction signal as a negative offset or the index addition signal as a positive offset into its table to arrive at the target index. In an example where the frequency corresponding to the target index of 0x11 is 9,500 kHz, the oscillator set register 270 outputs an OTC to the oscillator 220 that correspond to 9,500 kHz. The oscillator 220 then changes the frequency of the oscillator clock signal OSC_CLK to 9,500 kHz based on receipt of the OTC transmitted by the oscillator set register 270.

In a second oscillator auto-trimming operation, the offset frequency OFS, which is a difference between the frequency (e.g., 10,450 kHz) of the reference clock signal REF_CLK and the frequency (e.g., 9,500 kHz), may be 950 kHz. The divided signal DVS generated by the divider 250 corresponds to a value of 9.5, which is the result of dividing the offset frequency OFS of 950 kHz by the reference offset frequency REF_OFS of 100 kHz. The divided signal DVS of 9.5 in the second oscillator auto-trimming operation has been increased as compared to the divided signal of 4.5 in the first oscillator auto-trimming operation. When the divider 250 outputs the divided signal DVS in integer units, the value of the divided signal DVS output by the divider 250 is 9 or 10. For example, the value of 9.5 may be rounded up to 10 or rounded down to 9. In an exemplary embodiment, a frequency corresponding to the target index may be set close to the frequency of the reference clock signal REF_CLK when the MCU 260 outputs the index subtraction/addition signal instructing to add the divided signal DVS of 9 to the reference index. For example, adding 9 to a reference index of 0x11 yields a target index of 0x1a, which may correspond to a frequency of 10,500 kHz. The register 270 then outputs an OTC corresponding 10,500 kHz to the oscillator 220. The oscillator 220 then changes the frequency of the oscillator clock signal OSC_CLK to 10,500 kHz based on receipt of the OTC transmitted by the oscillator set register 270.

In the third oscillator auto-trimming operation, the offset frequency OFS, which is a difference between the frequency (e.g., 10,450 kHz) of the reference clock signal REF_CLK and the frequency (e.g., 10,500 kHz), may be 50 kHz. The divided signal DVS generated by the divider 250 corresponds to a value of 0.5, which is the result of dividing the offset frequency OFS of 50 kHz by the reference offset frequency REF_OFS of 100 kHz. When the divider 250 outputs the divided signal DVS in integer units, the value of the divided signal DVS output by the divider 250 is 0 or 1. In an exemplary embodiment, when oscillator auto-trimming is set to be terminated in the MCU 260 when the divided signal DVS is 0 or has been received three times, the oscillator auto-trimming may be terminated. When the auto-trimming is terminated, the OTC corresponding to the target index of 0x1a may be stored as a target OTC in the oscillator trimming code area 284 of the embedded flash memory 280. After the oscillator auto-trimming is finished, the oscillator clock signal OSC_CLK of the oscillator 220 has the frequency of 10,500 kHz, which has been adjusted within the range of the reference offset frequency REF_OFS of 100 kHz from the reference clock signal REF_CLK (10,450 kHz). Please note that the above is merely an example, as the frequency of the reference clock signal REF_CLK, the reference offset frequency REF_OFS, and the reference index may be changed to various values.

If the MCU 260 originally instructed addition of a divided signal DVS of 4 instead of subtraction of 5, the above trimming would have been accomplished within two operations. In an exemplary embodiment, the MCU 260 alternates between requesting addition and subtraction of the divided signal DVS from the reference index.

Figure 4:
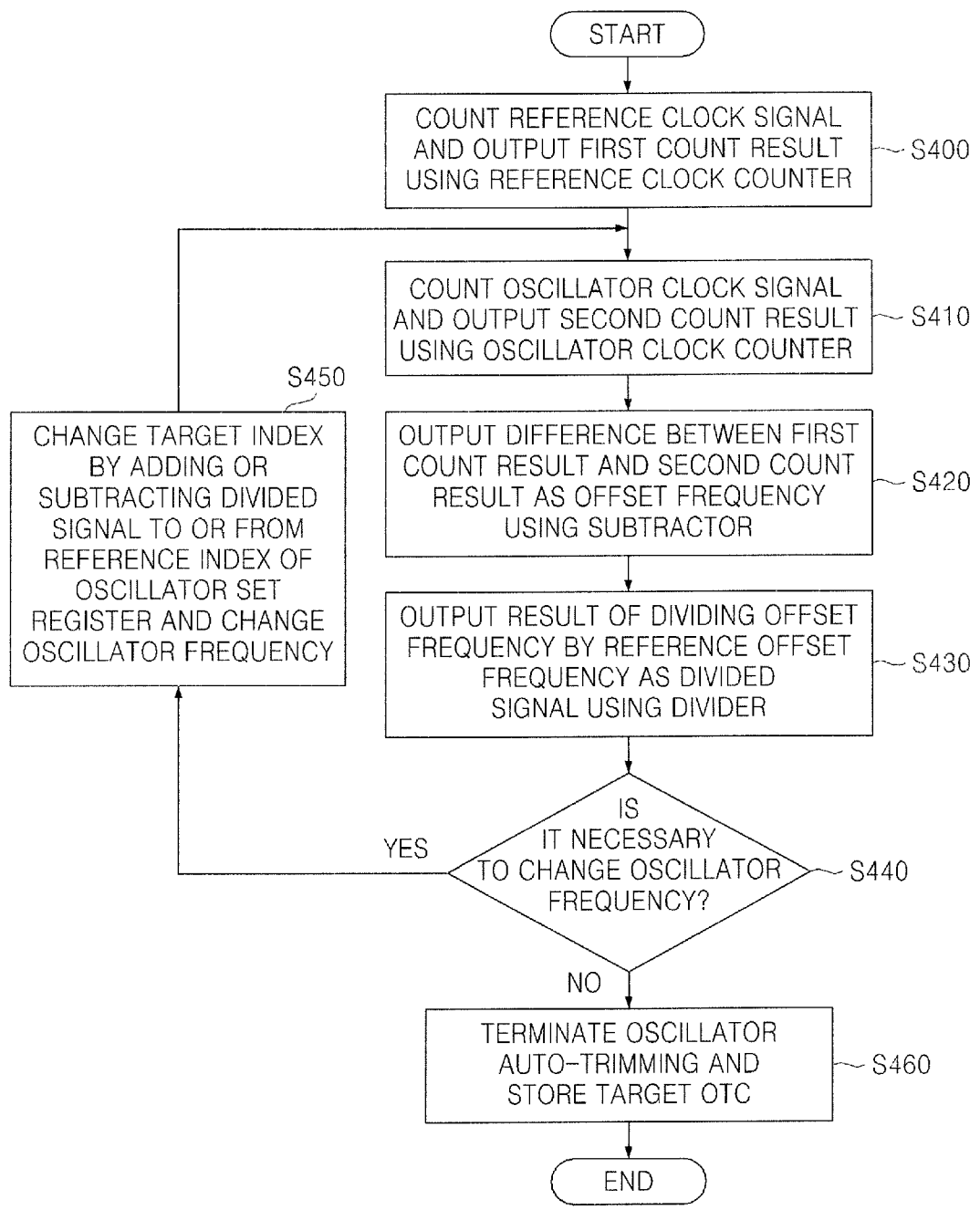
FIG. 4 is a flowchart of operations of the semiconductor device illustrated in FIG. 2 according to an exemplary embodiment of the inventive concept.

FIG. 4 is a flowchart of operations of the semiconductor device 200 illustrated in FIG. 2 according to an exemplary embodiment of the inventive concept. Referring to FIGS. 2 and 4, the reference clock counter 210 may receive a reference clock signal REF_CLK having a frequency necessary for the normal operation of the semiconductor device 200 from the external clock pin 205. In an exemplary embodiment, the reference clock counter 210 counts the reference clock signal REF_CLK for a reference time to measure the frequency of the reference clock signal REF_CLK. In an exemplary embodiment, the reference clock counter 210 counts the reference clock signal REF_CLK for the reference time and outputs a first count result REF_CLK_CNT in operation S400.

The oscillator clock counter 230 may count an oscillator clock signal OSC_CLK received from the oscillator 220 for a reference time to measure the frequency of the oscillator clock signal OSC_CLK. In an exemplary embodiment, the oscillator clock counter 230 counts the oscillator clock signal OSC_CLK for the reference time and outputs a second count result OSC_CLK_CNT in operation S410.

In an exemplary embodiment, the subtractor 240 receives the first count result REF_CLK_CNT from the reference clock counter 210 and the second count result OSC_CLK_CNT from the oscillator clock counter 230 and outputs a difference between the first count result REF_CLK_CNT and the second count result OSC_CLK_CNT as an offset frequency OFS in operation S420.

In an exemplary embodiment, the divider 250 receives the offset frequency OFS from the subtractor 240 and outputs a divided signal DVS corresponding to a result of dividing the offset frequency OFS by a reference offset frequency REF_OFS output from the MCU 260 in operation S430.

The MCU 260 may determine whether to repeat oscillator auto-trimming based on the divided signal DVS received from the divider 250. When the divided signal DVS is at least 1, e.g., when the offset frequency OFS is equal to or greater than the reference offset frequency REF_OFS, the MCU 260 may control the oscillator set register 270 to transmit an OTC to the oscillator 220 to repeat oscillator auto-trimming in operation S440. Alternatively, when the MCU 260 receives the divided signal DVS less than a predetermined number of times, for examples, less than three times, the MCU 260 may control the oscillator set register 270 to transmit the OTC to the oscillator 220 to repeat the oscillator auto-trimming in operation S440.

In an exemplary embodiment where the oscillator auto-trimming is controlled to be repeated by the MCU 260, the oscillator set register 270 receives the divided signal DVS from the divider 250 and changes a reference index into a target index by subtracting or adding the divided signal DVS from or to the reference index. In an exemplary embodiment, whether the oscillator set register 270 subtracts or adds the divided signal DVS from or to the reference index is determined by an index subtraction/addition signal output from the MCU 260. The oscillator set register 270 may read an OTC corresponding to the target index from the embedded flash memory 280 and transmit the OTC to the oscillator 220 using a buffering operation. In an exemplary embodiment, the oscillator 220 receives the OTC and generates the oscillator clock signal OSC_CLK having a particular frequency according to the OTC in operation S450.

However, when the divided signal DVS is less than 1, e.g., when the offset frequency OFS is less than the reference offset frequency REF_OFS, the MCU 260 may terminate the oscillator auto-trimming and store the OTC as a target OTC in the embedded flash memory 280 in operation S460.

Alternatively, when the MCU 260 receives the divided signal DVS at least the predetermined number of times, for example, at least three times, the MCU 260 may terminate the oscillator auto-trimming and store the OTC as the target OTC in the embedded flash memory 280 in operation S460.

FIG. 5 is a timing chart showing the operations illustrated in FIG. 4 according to an exemplary embodiment of the inventive concept. Referring to FIG. 5, the reference clock signal REF_CLK, the first count result REF_CLK_CNT, the oscillator clock signal OSC_CLK, and the second count result OSC_CLK_CNT are sequentially illustrated from the top of the timing chart. Referring to FIGS. 2 through 5, as described with reference to FIG. 3, it is assumed that the reference index is 0x16 and a frequency corresponding to an OTC corresponding to 0x16 is 10,000 kHz. Indexes adjacent the reference index are 0x15 and 0x17 and frequencies respectively corresponding to OTCs respectively corresponding to the adjacent indexes may be 9,900 kHz and 10,100 kHz. Similarly, a difference between frequencies respectively corresponding to two adjacent indexes may be 100 kHz. In this example, since the reference offset frequency REF_OFS stored in the MCU 260 is a difference between frequencies respectively corresponding to OTCs respectively corresponding to two adjacent indexes, it may be 100 kHz. It is also assumed that the oscillator auto-trimming operation is terminated when the divided signal DVS received by the MCU 260 is less than 1.

In a first oscillator auto-trimming operation OAT1, when the frequency of the reference clock signal REF_CLK is 10,450 kHz, the reference clock counter 210 and the oscillator clock counter 230 count the reference clock signal REF_CLK and the oscillator clock signal OSC_CLK, respectively, for the reference time and respectively output a first count result REF_CLK_CNT of 10,450 kHz and a second count result OSC_CLK_CNT of 10,000 kHz in operations S400 and S410. The subtractor 240 may output a difference between the first count result REF_CLK_CNT of 10,450 kHz and the second count result OSC_CLK_CNT of 10,000 kHz as an offset frequency OFS of 450 kHz in operation S420. The divider 250 may output a divided signal DVS of 4 corresponding to an integer of 4.5, which is the result of dividing the offset frequency OFS of 450 kHz by the reference offset frequency REF_OFS of 100 kHz, to the MCU 260 and the oscillator set register 270 in operation S430. Since the divided signal DVS of 4 received from the divider 250 is at least 1, the MCU 260 commands the oscillator auto-trimming operation be repeated in operation S440. The oscillator set register 270 may change the reference index into a target index according to the control of the MCU 260. When the MCU 260 outputs an index subtraction/addition signal instructing to subtract the divided signal DVS of 4 from the reference index, the target index may be 0x11. A frequency corresponding to an OTC corresponding to the target index of 0x11 may be 9,500 kHz. The frequency of the oscillator clock signal OSC_CLK of the oscillator 220 may be changed to 9,500 kHz by the OTC transmitted by the oscillator set register 270 in operation S450.

In a second oscillator auto-trimming operation OAT2, the oscillator clock counter 230 may count the oscillator clock signal OSC_CLK for the reference time and output a second count result OSC_CLK_CNT of 9,500 kHz in operation S410. The subtractor 240 may output a difference between the first count result REF_CLK_CNT of 10,450 kHz and the second count result OSC_CLK_CNT of 9,500 kHz as an offset frequency OFS of 950 kHz in operation S420. The divider 250 may output a divided signal DVS of 9 corresponding to an integer of 9.5, which is the result of dividing the offset frequency OFS of 950 kHz by the reference offset frequency REF_OFS of 100 kHz, to the MCU 260 and the oscillator set register 270 in operation S430. Since the divided signal DVS of 9 received from the divider 250 is at least 1, the MCU 260 commands the oscillator auto-trimming operation be repeated in operation S440. The oscillator set register 270 may change the reference index into the target index according to the control of the MCU 260. A frequency corresponding to the target index may be set to be close to the frequency of the reference clock signal REF_CLK when the MCU 260 outputs the index subtraction/addition signal instructing to add the divided signal DVS of 9 to the reference index, so that the target index may be changed to 0x1a. A frequency corresponding to an OTC corresponding to the target index of 0x1a may be 10,500 kHz. The frequency of the oscillator clock signal OSC_CLK of the oscillator 220 may be changed to 10,500 kHz by the OTC transmitted by the oscillator set register 270 in operation S450.

In a third oscillator auto-trimming operation OAT3, the offset frequency OFS, which is a difference between the frequency (10,450 kHz) of the reference clock signal REF_CLK and the frequency (10,500 kHz), may be 50 kHz. The divided signal DVS generated by the divider 250 corresponds to a value of 0.5, which is the result of dividing the offset frequency OFS of 50 kHz by the reference offset frequency REF_OFS of 100 kHz. The divided signal DVS of 0.5 in the third oscillator auto-trimming operation OAT3 has been decreased as compared to the divided signal of 4.5 in the first oscillator auto-trimming operation OAT1. At this time, the oscillator auto-trimming operation may be terminated. The current OTC corresponding to the target index of 0x1a may be stored as the target OTC in the oscillator trimming code area 284 of the embedded flash memory 280. After the oscillator auto-trimming is finished, the oscillator clock signal OSC_CLK of the oscillator 220 has the frequency of 10,500 kHz, which has been adjusted within the range of the reference offset frequency REF_OFS of 100 kHz from the reference clock signal REF_CLK (10,450 kHz). Please note that the above is merely an example, as the frequency of the reference clock signal REF_CLK, the reference offset frequency REF_OFS, and the reference index may be changed to various values.

After that time, the oscillator clock counter 230 may count the oscillator clock signal OSC_CLK for the reference time and output a second count result OSC_CLK_CNT of 10,500 kHz in operation S410. The subtractor 240 may output a difference between the first count result REF_CLK_CNT of 10,450 kHz and the second count result OSC_CLK_CNT of 10,500 kHz as an offset frequency OFS of 50 kHz in operation S420. The divider 250 may output a divided signal DVS of 0 corresponding to an integer of 0.5, which is the result of dividing the offset frequency OFS of 50 kHz by the reference offset frequency REF_OFS of 100 kHz, to the MCU 260 and the oscillator set register 270 in operation S430. Since the divided signal DVS of 0 received from the divider 250 is less than 1, the MCU 260 terminates the oscillator auto-trimming in operation S450. The MCU 260 may store the current OTC as the target OTC in the oscillator trimming code area 284 of the embedded flash memory 280 in operation S460. After the oscillator auto-trimming is finished, the oscillator clock signal OSC_CLK of the oscillator 220 has the frequency of 10,500 kHz, which has been adjusted within the range of the reference offset frequency REF_OFS of 100 kHz from the reference clock signal REF_CLK (10,450 kHz). Please note that the above is merely an example, as the frequency of the reference clock signal REF_CLK, the reference offset frequency REF_OFS, and the reference index may be changed to various values.

According to at least one embodiment of the inventive concept, frequency correction is independently performed on each die having different frequencies on a wafer and a target OTC of a semiconductor device included in each die is individually stored. Accordingly, test and correction may be performed on a plurality of dies at a time, thereby reducing a test time. In addition, even after the dies are separated from the wafer, test and correction may still be performed.

While the inventive concept has been particularly shown and described with reference to exemplary embodiments thereof, it will be understood by those of ordinary skill in the art that various changes in forms and details may be made therein without departing from the spirit and scope of the inventive concept.

What is claimed is:

1. A semiconductor device having an oscillator auto-trimming function, the semiconductor device comprising:
    an oscillator configured to generate an oscillator clock signal;
    a subtractor configured to receive a first count result and second count result and output a difference between the first count result and the second count result as an offset frequency;
    a divider configured to receive the offset frequency and output a divided signal corresponding to a result of dividing the offset frequency by a reference offset frequency; and
    a register configured to receive the divided signal, to change a reference index into a target index by subtracting or adding the divided signal from or to the reference index, and to transmit an oscillator trimming code corresponding to the target index to the oscillator,
    wherein the first count result is determined by a frequency of a reference clock signal and the second count result is determined by a frequency of the oscillator clock signal.

2. The semiconductor device of claim 1, further comprising:
    a micro control unit configured to transmit the reference offset frequency to the divider; and
    an embedded flash memory configured to store an oscillator trimming code corresponding to each of the reference and target indexes of the register.

3. The semiconductor device of claim 2, wherein when the divided signal is less than 1, the micro control unit stores the oscillator trimming code corresponding to the target index of the register as a target oscillator trimming code.

4. The semiconductor device of claim 2, wherein when the micro control unit receives the divided signal at least a predetermined number of times, the micro control unit stores the oscillator trimming code corresponding to the target index of the register as a target oscillator trimming code.

5. The semiconductor device of claim 4, wherein the predetermined number of times is 3.

6. The semiconductor device of claim 1, further comprising:
    a reference clock counter configured to count the reference clock signal for a reference time and output the first count result; and
    an oscillator clock counter configured to count the oscillator clock signal for the reference time and output the second count result.

7. The semiconductor device of claim 1, wherein the oscillator generates the oscillator clock signal according to the oscillator trimming code received from the register.

8. The semiconductor device of claim 1, further comprising an external clock pin configured to receive the reference clock signal from a source outside the device.

9. An oscillator auto-trimming method comprising:
receiving, by a subtractor, a first count result and a second count result to output a difference between the first count result and the second count result as an offset frequency;
receiving, by a divider, the offset frequency to output a divided signal, wherein the divided signal is a result of dividing the offset frequency by a reference offset frequency output from a micro control unit; and
receiving, by the micro control unit, the divided signal to determine whether to change an oscillator frequency,
wherein the first count result is determined by a frequency of a reference clock signal and the second count result is determined by a frequency of the oscillator clock signal.

10. The oscillator auto-trimming method of claim 9, further comprising a register receiving the divided signal, changing a reference index into a target index by subtracting or adding the divided signal from or to the reference index, and transmitting an oscillator trimming code corresponding to the target index to an oscillator.

11. The oscillator auto-trimming method of claim 10, further comprising the micro control unit storing an oscillator trimming code corresponding to the reference index and an oscillator trimming code corresponding to the target index in an embedded flash memory when the oscillator frequency does not need to be changed.

12. The oscillator auto-trimming method of claim 9, wherein the micro control unit determines that the oscillator frequency does not need to be changed when the divided signal is less than 1.

13. The oscillator auto-trimming method of claim 9, wherein the micro control unit determines that the oscillator frequency does not need to be changed when the micro control unit receives the divided signal at least a predetermined number of times.

14. The oscillator auto-trimming method of claim 13, wherein the predetermined number of times is 3.

15. The oscillator auto-trimming method of claim 9, further comprising:
counting, by a reference clock counter, the reference clock signal for a reference time to output the first count result; and
counting, by an oscillator clock counter, the oscillator clock signal for the reference time to output the second count result.

16. A semiconductor device comprising an oscillator auto-trimming function, the semiconductor device comprising:
an oscillator configured to generate an oscillator clock signal based on receipt of a trimming code;
a subtractor configured to receive a first count result and second count result and output a difference between the first count result and the second count result as an offset frequency;
a divider configured to receive the offset frequency and output a divided signal corresponding to a result of dividing the offset frequency by a reference offset frequency; and
a control circuit configured to determine a target frequency based on offsetting a reference index by the result and output the trimming code based on the target frequency.

17. The semiconductor device of claim 16, wherein the control circuit is configured to compare the current result with a prior result, wherein the offsetting is one of adding or subtracting the result to the reference index based on a result of the compare.

18. The semiconductor device of claim 17, wherein when the result of the compare indicates the current result is higher than the prior result, the offsetting performs an operation on the reference index that is opposite that of a prior offsetting operation.

19. The semiconductor device of claim 16, wherein the control circuit comprises:
a register storing a plurality of indexes; and
a micro control unit configured to output the reference offset frequency based on a difference between two of the indexes that are adjacent one another.

20. The semiconductor device of claim 16, further comprises a flash memory configured to store the trimming code along with an indicator indicating a die on which the device is fabricated.

* * * * *